(12) United States Patent
Karkkainen

(10) Patent No.: US 10,690,847 B2
(45) Date of Patent: Jun. 23, 2020

(54) METHOD OF MAKING A PHOTONIC CRYSTAL DEVICE AND PHOTONIC CRYSTAL DEVICE

(75) Inventor: Ari Karkkainen, Oulu (FI)

(73) Assignee: BRAGGONE OY, Oulu (FI)

( * ) Notice: Subject to any disclaimer, the term of this patent is extended or adjusted under 35 U.S.C. 154(b) by 555 days.

(21) Appl. No.: 11/917,506

(22) PCT Filed: Jun. 15, 2006

(86) PCT No.: PCT/FI2006/000209
§ 371 (c)(1),
(2), (4) Date: Jan. 4, 2008

(87) PCT Pub. No.: WO2006/134218
PCT Pub. Date: Dec. 21, 2006

(65) Prior Publication Data
US 2008/0284320 A1    Nov. 20, 2008

Related U.S. Application Data

(60) Provisional application No. 60/691,315, filed on Jun. 15, 2005.

(51) Int. Cl.
*H01L 51/52* (2006.01)
*B82Y 20/00* (2011.01)
*G02B 6/122* (2006.01)

(52) U.S. Cl.
CPC .......... *G02B 6/1225* (2013.01); *B82Y 20/00* (2013.01); *H01L 51/5275* (2013.01)

(58) Field of Classification Search
CPC ......... H01L 31/02167; H01L 31/02168; H01L 51/5256; H01L 51/5262; H01L 51/5265;
(Continued)

(56) References Cited

U.S. PATENT DOCUMENTS 2,466,119 A * 4/1949 Moulton ............... G02B 1/113
359/580
4,412,255 A * 10/1983 Kuhlman et al. ............ 348/819
(Continued)

FOREIGN PATENT DOCUMENTS

| JP | 11258403 A | * | 9/1999 |
| JP | 2004-030964 A | | 1/2004 |
| WO | 2005039752 A1 | | 5/2005 |

OTHER PUBLICATIONS

Machine Translation of JP 11258403 A, retrieved Aug. 13, 2014.*
PCT Search Report for Serial No. PCT/FI2006/000209 dated Oct. 30, 2006.

*Primary Examiner* — Anh T Mai
*Assistant Examiner* — Steven Y Horikoshi
(74) *Attorney, Agent, or Firm* — McCormick, Paulding & Huber PLLC

(57) ABSTRACT

The invention is based on the idea of providing a light emitting diode (OLED) device which contains a substrate with a photonic crystal, whereby the formed film structure induces enhancement of the liberation of photons trapped inside the light emitting device structure. The photonic crystal structure is a film structure on a substrate produced using a combination of high and low refractive index materials, at least one of the materials being based on a liquid phase deposited metal-oxide or metalloid oxide material. By means of the invention light trapped due to total internal reflection in a waveguide acting light emitting structure can be extracted efficiently from the device by introducing the photonic crystal device structure between the substrate and conductive anode layer.

22 Claims, 3 Drawing Sheets

(58) Field of Classification Search
CPC ..... H01L 51/5275; G02B 1/111; G02B 1/113; G02B 1/115; G02B 1/116; G02B 1/118; G02B 5/285–288; G02B 5/0825; G02B 5/0833; G02B 6/1225

See application file for complete search history.

(56) References Cited

U.S. PATENT DOCUMENTS

| | | | | |
|---|---|---|---|---|
| 4,705,760 | A | * | 11/1987 | Kaganowicz et al. .......... 438/94 |
| 4,929,278 | A | * | 5/1990 | Ashley .................... G02B 1/111 |
| | | | | 106/287.12 |
| 5,372,958 | A | * | 12/1994 | Miyasaka et al. ............ 438/486 |
| 5,667,880 | A | * | 9/1997 | Okaniwa ............. C03C 17/3417 |
| | | | | 359/359 |
| 5,852,513 | A | * | 12/1998 | McDole ................... G02B 1/11 |
| | | | | 348/834 |
| 6,180,188 | B1 | * | 1/2001 | Belleville et al. ............. 427/515 |
| 6,395,558 | B1 | * | 5/2002 | Duveneck et al. ............ 436/172 |
| 6,406,801 | B1 | * | 6/2002 | Tokito et al. ................. 428/690 |
| 6,587,620 | B2 | * | 7/2003 | Koyama et al. ................ 385/37 |
| 2001/0026125 | A1 | * | 10/2001 | Yamazaki et al. ............ 313/505 |
| 2001/0034140 | A1 | * | 10/2001 | Shioya et al. ................ 438/789 |
| 2001/0048379 | A1 | * | 12/2001 | Kaikuranta et al. ............ 341/22 |
| 2003/0127974 | A1 | * | 7/2003 | Miyazawa .................... 313/504 |
| 2004/0164293 | A1 | * | 8/2004 | Maloney et al. ................ 257/40 |
| 2005/0040753 | A1 | * | 2/2005 | Osame et al. ................ 313/500 |
| 2005/0077820 | A1 | * | 4/2005 | Onishi et al. ................ 313/506 |
| 2005/0116625 | A1 | * | 6/2005 | Park et al. .................... 313/504 |
| 2005/0127831 | A1 | * | 6/2005 | Takeuchi ............... H05B 33/22 |
| | | | | 313/506 |
| 2005/0162355 | A1 | * | 7/2005 | Yamazaki ....................... 345/76 |
| 2005/0174046 | A1 | * | 8/2005 | Hasegawa et al. ........... 313/504 |
| 2005/0275944 | A1 | * | 12/2005 | Wang et al. .................. 359/576 |

\* cited by examiner

Light Emission

METHOD OF MAKING A PHOTONIC CRYSTAL DEVICE AND PHOTONIC CRYSTAL DEVICE

CROSS REFERENCE TO RELATED APPLICATIONS

This application is entitled to the benefit of and incorporates by reference essential subject matter disclosed in International Patent Application No. PCT/FI2006/000209 filed on Jun. 15, 2006 and U.S. Provisional Application No. 60/691,315 filed Jun. 15, 2005.

BACKGROUND OF THE INVENTION

Field of the Invention

The present invention is based on the idea of providing a light emitting diode (OLED) device that includes a substrate with a photonic crystal, whereby the formed film structure induces enhancement of the liberation of photons trapped inside the OLED device structure and substrate.

Description of Related Art

Organic light emitting diodes (OLED) have shown great promise for flat-panel displays and as alternative solid state illumination sources. This technology relies upon thin-film layers of materials coated on a substrate. However, as is well known, much of the light output from the emissive elements in the OLED is trapped within the device. Because the light emission from the OLED is Lambertian, light is emitted equally in all directions so that some of the light is emitted forward towards a viewer, some is emitted to the back of the device and is either reflected forward to the viewer or absorbed, and some of the light is emitted laterally and trapped and absorbed by the various layers comprising the device. In general, up to 80% of the light may be lost leading to poor external efficiency of the device.

A variety of techniques have been proposed for improving the outcoupling of light from thin-film displays. For example, diffraction gratings have been proposed to control the attributes of light emission from thin polymer films by inducing Bragg scattering of light that is guided laterally through the emissive layers. Brightness enhancement films having diffractive properties, and surface and volume diffusers, have been proposed as well. Moreover, the use of micro-cavities and scattering techniques is also known for enhancement purposes. However, none of these approaches capture all, or nearly all, of the light produced.

Furthermore, it is known in the art to use a periodic, corrugated, grating structure for inducing surface plasmon coupling for the light emitting layer in an organic luminescent device, thereby inhibiting lateral transmission and wave guiding of emitted light while increasing the efficiency and the light output of the structure. It is theoretically possible to couple up to 93% of the light emitted by the organic luminescent materials in an organic luminescent device. This kind of device can be made by creating the grating geometry for photoluminescent surface plasmon coupling by exposing a photoresist on glass with an interferometric pattern, followed by deposition of subsequent layers that replicate the underlying surface profile. This approach is not compatible and practical with the current manufacturing techniques used to make OLED displays, since for bottom-emitting OLED displays, manufacturing starts with a glass substrate that is coated with a layer of conductive indium tin oxide (ITO) which is patterned to provide conductors for thin-film transistors located on the substrate. The use of photoresists for creating plasmon inducing gratings is problematical because the photoresist is an electrical insulator, thereby isolating the underlying ITO conductors from the OLED materials.

Further, it has also been suggested that the use of surface plasmon coupling can be an efficient means for outcoupling electroluminescence in an OLED device by using shadow masks on any desirable substrate. The use of shadow masks is not a practical way to create the gratings because of the small dimensions of the gratings.

Therefore, there is a clear demand for an improved organic light emitting diode structure that eliminates at least a part of the problems noted above and improves the efficiency of the devices and displays and meets the commercial manufacturing requirements.

SUMMARY OF THE INVENTION

It is an aim of the present invention to provide a new light emitting diode device structure.

It is another aim of the invention to provide a method of manufacturing such a light emitting diode device structure.

The present invention is based on the idea of providing a light emitting diode (OLED) device which contains a substrate with a photonic crystal, whereby the formed film structure induces enhancement of the liberation of photons trapped inside the light emitting device structure.

The photonic crystal structure is a film structure on a substrate produced using a combination of high and low refractive index materials, at least one of the materials being based on a liquid phase deposited metal-oxide or metalloid oxide material.

More specifically, the present invention is mainly characterized by what is stated in the characterizing part of claim 1.

The light emitting diodes according to the invention are characterized by what is stated in the characterizing parts of claims 23, 28 and 30.

Photonic crystal devices according to the invention are characterized in claims 31-35.

Considerable advantages are obtained by the invention. Thus, the light trapped due to total internal reflection in a waveguide acting light emitting structure can be extracted efficiently from the device by introducing the photonic crystal device structure between the substrate and conductive anode layer.

The photonic crystal layers deposition can be carried out by conventional and cost-efficient processing from the liquid phase, including spin-on, spray, ink-jet, roller, gravure, flexo-graphic, curtain and screen printing coating methods, but are not limited to these. The patterning of the photonic crystal layers can be performed via direct lithographic patterning, conventional lithographic masking and etching procedure, imprinting and embossing, but are not limited to these.

The photonic crystal devices according to the invention can be utilized as a dual display and keypad lightsource, they can be utilized in passive matrices or active matrix displays (such as in TV's, cell phones, PDA's etc.) and as illumination sources.

DETAILED DESCRIPTION OF THE INVENTION

The present invention concerns the production of a photonic crystal structure, which can be provided on either or both sides of a substrate, which optionally is flexible.

Basically, the invention comprises the steps of
depositing on the substrate a first optical material having a first index of refraction to form a first layer; and
depositing on the first layer a second layer of a second optical material having a second index of refraction, which is lower than that of the first optical material;
depositing on the second layer a third layer of a third optical material having a index of refraction, which is same or lower than that of the second optical material;
wherein
at least one of the optical materials is a material selected from the group of liquid phase processible metal oxides, liquid phase processible metalloid oxides and mixtures thereof;
the index of refraction of the first optical material is 1.9 or higher at a wavelength of 632.8 nm;
the index of refraction of the second and third optical material is 1.45 or lower at a wavelength of 632.8 nm;
it is preferred that at least one of the optical materials is micro patterned to comprise the photonic crystal structure;

As a result, using these optical materials a two- or three-layered photonic crystal device is obtained. It can be incorporated into most OLED device configurations and structures.

Conventional, and potential, structures includes both very simple structures comprising a single anode and cathode and more complex devices, such as passive matrix displays comprised of orthogonal arrays of anodes and cathodes to form pixels, and active-matrix displays where each pixel is controlled independently, for example, with thin-film transistors (TFTs).

Figure 1:
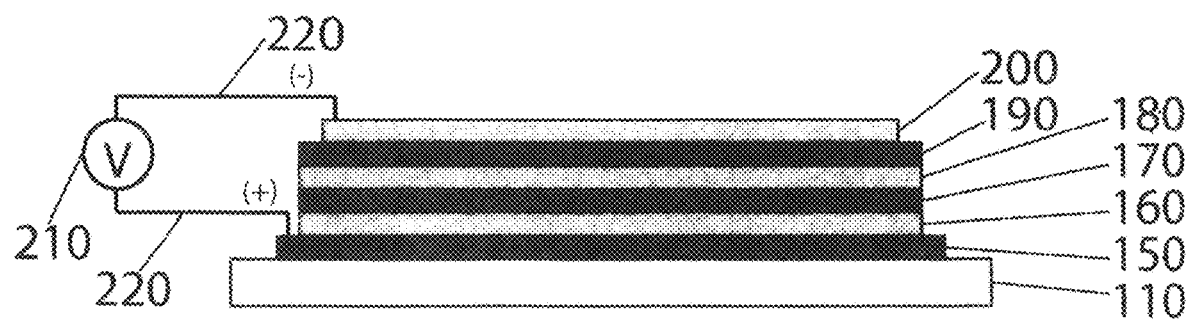
FIG. 1 shows the cross-section of a conventional OLED structure.

A typical OLED structure 100 known in the art is shown in FIG. 1 and is comprised of a substrate 110, an anode 150, a hole-injecting layer 155, a hole-transporting layer 160, a light-emitting layer 165, an electron-transporting layer 170, and a cathode 175. These layers are described more in detail below. The anode and cathode of the OLED are connected to a voltage/current source 180 through electrical conductors 185. The OLED is operated by applying a potential between the anode and cathode such that the anode is at a more positive potential than the cathode. Holes are injected into the organic EL element from the anode and electrons are injected into the organic EL element at the cathode. This typical OLED structure is not supposed to be fully inclusive describing all the possible variations that can be applied to produce an organic light emitting diode.

The OLED device of this invention is typically provided over a supporting substrate where either the cathode or anode can be in contact with the substrate. The electrode in contact with the substrate is conventionally referred to as the bottom electrode. Usually, the bottom electrode is the anode, but this invention is not limited to that configuration. The substrate can either be light transmissive or opaque, depending on the intended direction of light emission. The light transmissive property is desirable for viewing the EL emission through the substrate. Transparent glass or plastic is commonly employed in such cases. For applications where the EL emission is viewed through the top electrode, the transmissive characteristic of the bottom support is immaterial, and therefore the support can be light transmissive, light absorbing or light reflective. Substrates for use in this case include, but are not limited to, glass, plastic, semiconductor materials, silicon, ceramics, and circuit board materials. Of course it is necessary to provide in these device configurations a light-transparent top electrode.

When EL emission is viewed through the anode of the device, the anode should be transparent or substantially transparent to the emission of interest. Common transparent anode materials used in this invention are indium-tin oxide (ITO), indium-zinc oxide (IZO) and tin oxide, but other metal oxides can work including, but not limited to, aluminum- or indium-doped zinc oxide, magnesium-indium oxide, and nickel-tungsten oxide. In addition to these oxides, metal nitrides, such as gallium nitride, and metal selenides, such as zinc selenide, and metal sulfides, such as zinc sulfide, can be used as the anode. For applications, where EL emission is viewed only through the cathode electrode, the transmissive characteristics of anode are immaterial and any conductive material can be used, transparent, opaque or reflective. Example conductors for this application include, but are not limited to, gold, iridium, molybdenum, palladium, and platinum.

The selected anode materials are commonly deposited by any suitable means, such as evaporation, sputtering, chemical vapor deposition, or electrochemical means. The anodes can be patterned using well-known photolithographic processes. Optionally, anodes may be polished prior to application of other layers to reduce surface roughness so as to minimize shorts or enhance reflectivity.

While not always necessary, it is often useful to provide a hole-injecting layer (HIL) between the anode and hole-transporting layer. The hole-injecting material can serve to improve the film formation property of subsequent organic layers and to facilitate injection of holes into the hole-transporting layer. Suitable materials for use in the hole-injecting layer include, but are not limited to, porphyrinic compounds, plasma-deposited fluorocarbon polymers and some aromatic amines.

The hole-transporting layer (HTL) contains at least one hole-transporting compound, such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Another class of useful hole-transporting materials includes polycyclic aromatic compounds. Tertiary aromatic amines with more than two amine groups may be used including oligomeric materials. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

The Light-Emitting Layer (LEL) of the organic EL element includes a luminescent or fluorescent material, where electroluminescence is produced as a result of electron-hole pair recombination in this region. The light-emitting layer can be comprised of a single material (a molecular material or a polymer), but more commonly consists of a host material doped with a guest compound or compounds where light emission comes primarily from the dopant and can be of any color. The host materials in the light-emitting layer can be an electron-transporting material, as defined below, a hole-transporting material, as defined above, or another material or combination of materials that support hole-electron recombination. The dopant is usually chosen from highly fluorescent dyes, but phosphorescent compounds, e.g., transition metal complexes and phosphorescent dendrimers are also applied widely. Polymeric materials such as polyfluorenes and polyvinylarylenes (e.g., poly(p-phenylenevinylene), PPV) can also be used as the host material.

With these materials, small molecule dopants can be molecularly dispersed into the polymeric host, or the dopant could be added by copolymerizing a minor constituent into the host polymer. An important relationship for choosing a dye as a dopant is a comparison of the bandgap potential which is defined as the energy difference between the highest occupied molecular orbital and the lowest unoccupied molecular orbital of the molecule. For efficient energy transfer from the host to the dopant molecule, a necessary condition is that the band gap of the dopant is smaller than that of the host material. For phosphorescent emitters it is also important that the host triplet energy level of the host be high enough to enable energy transfer from host to dopant. Metal complexes of 8-hydroxy-quinoline and similar derivatives constitute one class of useful host compounds capable of supporting electroluminescence. Other classes of useful host materials include, but are not limited to: derivatives of anthracene, such as 9,10-di-(2-naphthyl)anthracene and derivatives thereof, distyrylarylene derivatives and benzazole derivatives. Carbazole derivatives are particularly useful hosts for phosphorescent emitters. Useful flourescent dopants include, but are not limited to, derivatives of anthracene, tetracene, xanthene, perylene, rubrene, coumarin, rhodamine, and quinacridone, dicyanomethylenepyran compounds, thiopyran compounds, polymethine compounds, pyrilium and thiapyrilium compounds, fluorene derivatives, periflanthene derivatives, indenoperylene derivatives, bis (azinyl)amine boron compounds, bis(azinyl)methane compounds, and carbostyryl compounds.

Electron-Transporting Layer (ETL): The preferred thin-film-forming materials for use in forming the electron-transporting layer of the organic EL elements of this invention are metal chelated oxinoid compounds, including chelates of oxine itself (also commonly referred to as 8-quinolinol or 8-hydroxyquinoline). Such compounds help to inject and transport electrons, exhibit high levels of performance, and are readily fabricated in the form of thin-films. Exemplary oxinoid compounds were listed previously. Other electron-transporting materials include various butadiene derivatives, benzazoles and triazines.

When light emission is viewed solely through the anode, the cathode used in this invention can be comprised of nearly any conductive material. Desirable materials have good film-forming properties to ensure good contact with the underlying organic layer, promote electron injection at low voltage, and have good stability. Useful cathode materials often contain a low work function metal (<4.0 eV) or metal alloy. One preferred cathode material is comprised of a Mg:Ag alloy wherein the percentage of silver is in the range of 1 to 20%. Another suitable class of cathode materials includes bilayers comprising a thin electron-injection layer (EIL) in contact with the organic layer (e.g., ETL), which is capped with a thicker layer of a conductive metal. Here, the EEL preferably includes a low work function metal or metal salt, and if so, the thicker capping layer does not need to have a low work function. One such cathode is comprised of a thin layer of LiF followed by a thicker layer of Al. If light emission is viewed through the cathode, the cathode must be transparent or nearly transparent. For such applications, metals must be thin or one must use transparent conductive oxides, or a combination of these materials. Cathode materials are typically deposited by evaporation, sputtering, or chemical vapor deposition. When needed, patterning can be achieved through many well known methods including, but not limited to, through-mask deposition, integral shadow masking, laser ablation, and selective chemical vapor deposition.

As was discussed in general above, the present structure basically comprises two or three overlapping layers consisting of materials having different refractive indices. It is preferred to have an index of refraction of the first optical material equal to or greater than 1.9 at a wavelength of 632.8 nm and a refractive index of 1.45 or less at the same wavelength of the second optical material. In the case of three layer structure it is preferred that the third optical material layer has same or lower refractive index compared to the second optical material. One or any of the layers is/are formed in liquid phase from a metal or metalloid oxide material and one or any of the layers can be micro-patterned using either conventional lithographic patterning procedures applying photoresists and etching steps or optionally one or any of the material layers can be made photosensitive which enables direct photopatterning of the optical material layer with UV-lithography.

The incorporation of a photonic crystal structure into an OLED structure of the basic kind described above is shown in FIGS. 2 to 4.

Figure 2:
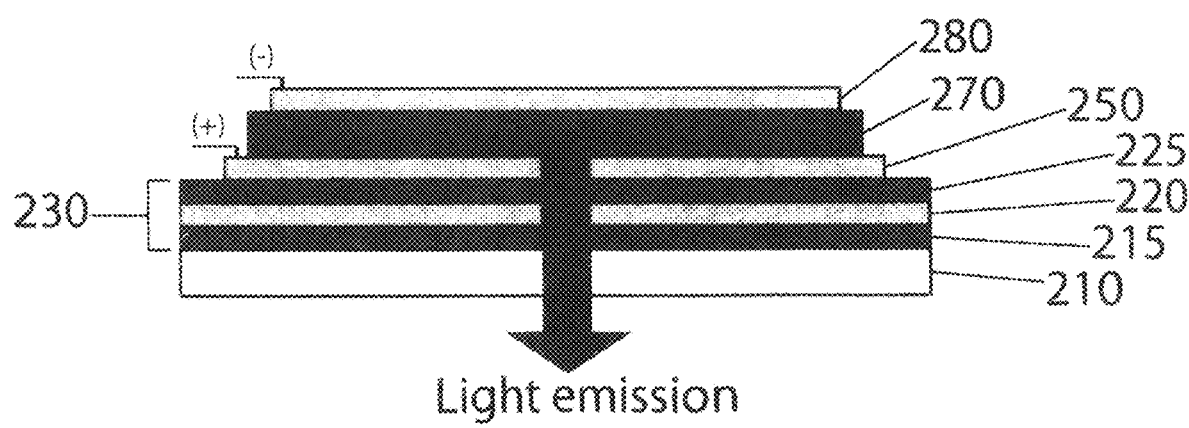
FIG. 2 depicts the cross-section of an OLED structure according to a first embodiment of the present invention.

Turning first to the embodiment of FIG. 2, it can be noted that the OLED device 200 depicted in that drawing is a bottom-emitting organic light emitting diode (OLED) device that includes: a substrate 210; a plurality of micro-optical structures (photonic crystal 230) formed on the substrate containing a continuous or patterned first optical material 215 having a first refractive index; a second optical material 220 that can be patterned or a continuous film having second refractive index lower than the first refractive index; a third alternative optical material 225 that can be patterned or a continuous film having third refractive index maximally the same or a lower than the second refractive index; a transparent conductive anode electrode layer 250 formed over the insulating photonic crystal; an OLED material layer(s) 270 formed over the anode electrode layer; and a second electrode (cathode) layer 280 formed over the OLED material layer.

At least one of the micro-optical layers is formed from liquid phase using metal or metalloid oxide material. The photonic crystal materials can be deposited and cured at any temperature between 100° C. and 700° C., preferably between 200° and 400° C. The first optical material in the photonic crystal layers has a refractive index of 1.9 or higher, even more preferably over 2.0 and the second and the third optical materials in the photonic crystal layers have refractive index 1.45 or lower, even more preferably less than 1.4.

The photonic crystal layers deposition can be carried out by spin-on, spray, ink-jet, roller, gravure, flexo-graphic, curtain and screen printing coating methods, but are not limited to these. The patterning of the photonic crystal layers can be done via direct lithographic patterning (meaning all the optical material layers described above can be made photosensitive and patterned as negative tone materials using lithography), conventional lithographic masking and etching procedure, imprinting and embossing, but are not limited to these. The electrodes may include very simple structures comprising a single anode and cathode to more complex devices, such as passive matrix displays comprised of orthogonal arrays of anodes and cathodes to form pixels, and active-matrix displays where each pixel is controlled independently, for example, with thin-film transistors (TFTs).

Figure 3:
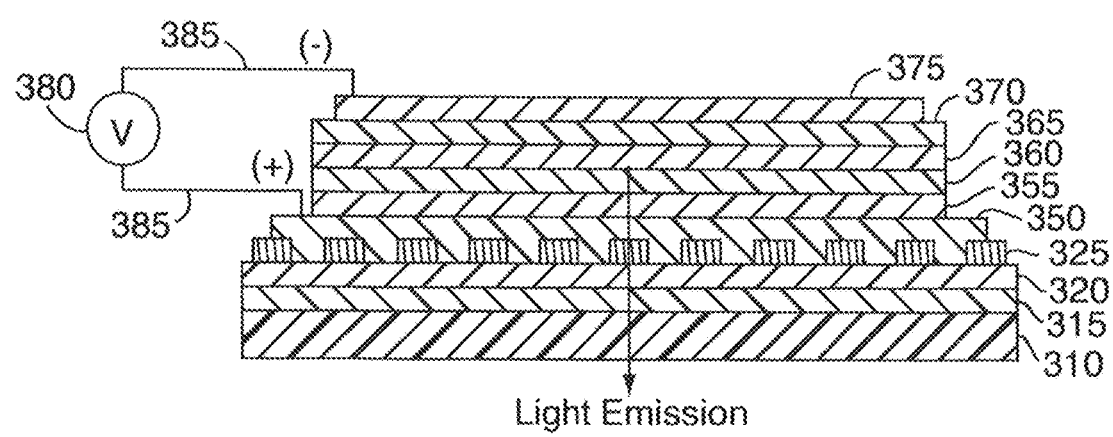
FIG. 3 shows the cross-section of a second OLED embodiment.

A typical structure 300 exemplifying a first embodiment of the invention is shown in FIG. 3 and is comprised of a substrate 310, a continuous high refractive index layer 315, a continuous low refractive index layer 320, a patterned low refractive index layer 325, an anode 350, a hole-injecting layer 355, a hole-transporting layer 360, a light-emitting layer 365, an electron-transporting layer 370, and a cathode 375. The anode and cathode of the OLED are connected to a voltage/current source 380 through electrical conductors 385.

In an alternative embodiment, the OLED device is a bottom-emitting organic light emitting diode (OLED) device that includes a substrate; a plurality micro-optical structures (photonic crystal) formed on the substrate containing patterned optical material having first refractive index; a second optical material that can be patterned or a continuous film having second refractive index higher than that of the first refractive index; a transparent conductive anode electrode layer formed over the insulating photonic crystal; an OLED material layer(s) formed over the anode electrode layer; and a second electrode (cathode) layer formed over the OLED material layer. At least one of the micro-optical layers is formed from liquid phase using a metal or metalloid oxide material. The photonic crystal materials can be deposited and cured at any temperature between 100° C. and 700° C., preferably between 200° and 400° C.

The first optical material in the photonic crystal layers has a refractive index 1.45 or lower, but more preferably less than 1.4 and the second materials in the photonic crystal layer has a refractive index 1.9 or higher, but more preferably over 2.0. In some cases it is preferred to have the second optical layer in the shape of a well planarizing film.

The photonic crystal layers deposition can be effected by spin-on, spray, ink-jet, roller, gravure, flexo-graphic, curtain and screen printing coating methods, but are not limited to these. The patterning of the photonic crystal layers can be done via direct lithographic patterning, conventional lithographic masking and etching procedure, imprinting and embossing, but are not limited to these.

The electrodes may include very simple structures comprising a single anode and cathode to more complex devices, such as passive matrix displays comprised of orthogonal arrays of anodes and cathodes to form pixels, and active-matrix displays where each pixel is controlled independently, for example, with thin-film transistors (TFTs).

Figure 4:
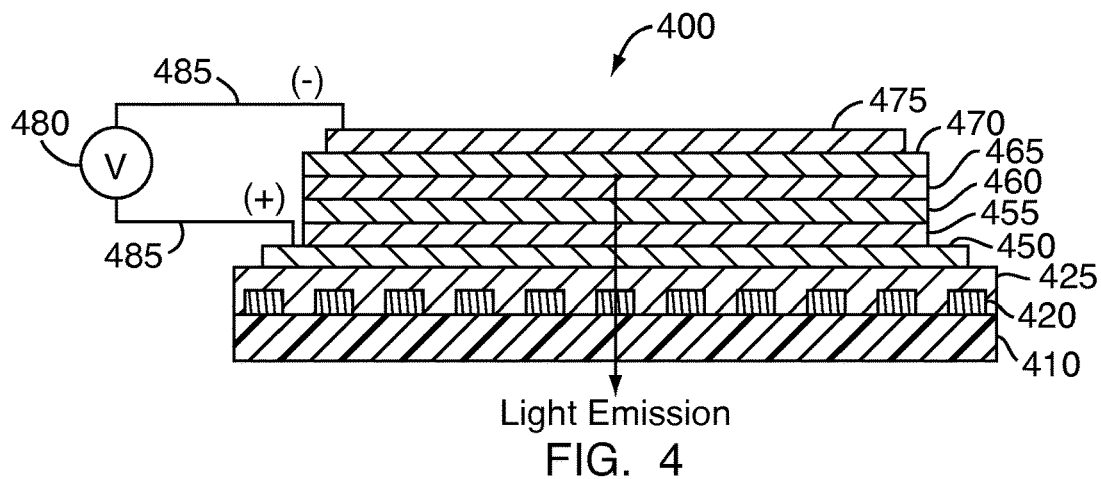
FIG. 4 shows the cross-section of a third OLED embodiment.

A typical structure 400 according to an alternative embodiment of the invention is shown in FIG. 4 and is comprised of a substrate 410, a pattered low refractive index layer 420, a continuous and planarizing high refractive index layer 425, an anode 450, a hole-injecting layer 455, a hole-transporting layer 460, a light-emitting layer 465, an electron-transporting layer 470, and a cathode 475. The anode and cathode of the OLED are connected to a voltage/current source 480 through electrical conductors 485.

As discussed above, it is an object of the invention to provide a synthesis and fabrication method for high quality, high refractive index and low refractive index metal or metalloid oxide materials, coatings and structures. These structures and materials enable the fabrication of the described photonic crystal structures facilitating high external efficiency in OLED devices.

All the refractive indices stated below are indicated for a wavelength of 632.8 nm.

The use of metal oxide materials makes it possible to produce a film or a patterned structure having a high index of refraction (1.9 or even higher). The use of metalloid oxide materials makes it possible to produce a film or a patterned structure having a low index of refraction (1.40 or lower) and a film or a patterned structure having a moderately high index of refraction (up to about 1.7). Both the metal oxide materials and metalloid oxide materials can be made photosensitive enabling direct photopatterning of the produced film using photolithography. This is made possible through synthetically modifying the material where organic groups are introduced that can react during the photolithography process.

Metal oxide materials, such as "pure" titanium or tantalum oxide precursors, suitably give refraction indices of about 2.0 or greater. During the synthesis of the final metal oxide polymer it might be however essential to introduce some organic groups to the final composition to facilitate necessary properties. The necessary properties include photopatternability; processability of the material (meaning good film formation and adhesion during deposition); stabilization of the final material (meaning good shelf life and stability of the synthesized material). Introduction of these organic groups to the "pure" metal oxide material lowers usually the index of refraction of the final film. The refractive index of the produced film is greatly dependent on the composition of the synthesized material, but is in addition dependent on the final density of the produced film. The curing conditions and method, the used processing solvent(s), and possible other additives in the material dictate the final density of the produced film.

Metalloid oxide materials include silicon based oxide materials, such as siloxanes (silsesquioxanes). The refractive indices of such materials are usually in the range of 1.30 to 1.7. The refractive index of pure $SiO_2$ is about 1.45. When a "backbone" of Si—O—Si base is being modified by bonding of organic groups to the silicon atoms, tuning of the refractive index is reached. If an index below 1.45 is sought, one should use, for example, short alkyl chained (1-3 carbons) organosilicon starting materials (precursors) in the synthesis. Further lower refractive index (below 1.38) can be obtained using fluorinated, short-chained organosilicon precursors. If an index greater than 1.45 is aimed at, one should use, for example, aromatic non-fluorinated organosilicon precursors, such as phenyl (1.57), naphthalene (1.64), phenanthrene (1.67) or similar groups in the synthesis. As with the metal oxide materials it is usually necessary to introduce also some other organic groups to the final composition that will affect the refractive index of the final composition the way or the other. The necessary properties may include photopatternability; processability of the material; and stabilization. Also as in case with the metalloid oxide materials the refractive index is dependent on the final density of the produced film. The curing conditions and method, the used processing solvent(s), and possible other additives in the material dictate the final density of the produced film.

Other important aspects relating to the utilization of the present metal oxide and metalloid oxide materials in the connection with OLED devices are:

they must not absorb light in the range of visible light (400 nm to 600 nm), or at least absorption in that wavelength range should be small. The absorption at these wavelengths arises usually from the organic functionalities used in the material composition.

as already mentioned above they can be cured at any temperatures between 100° C. and 700° C., preferably between 200° and 400° C. The cured films and structures must be stable after curing (no change in optical or other properties). Preferably they have to be able to withstand annealing temperatures during further processing steps over 400° C. The further processing steps include deposition of further material layers on top, such as anode layer, that is usually a high temperature deposition process.

the cured films may need to have also a high resistance against the usual wet-etching, striping or developer solutions used in lithographic patterning of the subsequent device layers deposited on top.

For the sake of completeness it should be pointed out that if the micro-optical structure functions (couples out light from the used substrate or device) properly using material films and structures with indices from 1.3 to 1.7, the use of a metal oxide material in the device is not quite necessary. In this case all the required optical material layers can be utilized using solely metalloid oxide material based structures and/or films having the required low refraction index and high refractive index material layers.

Metal Oxide High Index Polymers

According to one embodiment, when starting out from metal halogenides, the halogenides are first reacted with an organic compound containing carbon-oxygen bonds to produce a compound exhibiting a metal-oxygen-carbon bond. Oftentimes, metal halogenides are processed by reacting them first with, e.g., an alcohol in order to produce the corresponding alkoxide. However, such a reaction is not necessary. A metal halogenide can be reacted with the alkoxide of the same or another metal. The molecule will contain residual groups of both the alkoxide and the halogenide. It is also possible to hydrolyse the halogenide in an inert solvent using water and then to continue reaction.

When alkoxides are produced from the metal oxide precursors, they cannot be used directly as such but they have to be prereacted/prepolymerized to convert them into processible and stable materials.

In the invention, at least one of the components of the photonic crystal layers is deposited from liquid phase using, for example, spin-on technology. In order to modify the reactants for such processing they must be made soluble in the selected solvent. The synthesized material (prepolymer) will take up its final form during the heat-treatment of the spin-on processed film, the metal oxide forming a final matrix form through cross-linking.

According to one aspect of the invention, two or more different compounds are used, the differences between the compounds residing in the metal atoms and/or the ligands.

It is also possible to use only one reactant compound in the synthesis method described below (cf. the example titled "Tantalum oxide hybrid polymer 2"). The synthesis route is one which processes the reactant into a prepolymerized form in which it can be subjected to further processing to give a layer having a refraction index greater than 2 and with low or practically no absorption. The material is non-corrosive and stable in the processing conditions and solvent described.

In the method described below in more detail, halogenides are used and it includes a step where hydrohalogenides are removed and/or where the materials are neutralized. The use of halogenides as starting materials of the metal or metalloid oxide materials represents, however, a preferred embodiment because by employing them it is possible to reach higher an index of refraction and lower absorbance than with the corresponding alkoxides.

Based on the above, the method according to the invention typically comprises the steps of providing a precursor of the metal oxide material, containing a single metal element or a preformed precursor, which contains a combination of two or more metal elements;

optionally providing an organic compound, which contains at least one functional group capable of reacting with the metal element of the precursor;

reacting the metal element precursor with the organic compound, preferably in a liquid medium to provide a reaction product; and recovering the reaction product.

According to a preferred embodiment of the method, the invention comprises the steps of providing a precursor of the metal oxide material, containing a single metal element or a preformed precursor, which contains a combination of two or more metal elements;

A particularly preferred method of forming an intermediate compound suitable for producing a film or a patterned structure, to be used in a photonic crystal structure, comprises the steps of providing at least two starting reagents, at least one of which comprises a metal oxide precursor;

reacting the reagents with each other to form a reaction product comprising a modified metal oxide precursor;

recovering the reaction product; and reacting the reaction product with a compound selected from the group of organic compounds, water and aqueous solutions, for converting the reaction product into an intermediate product (prepolymerized material) which is suitable for liquid phase processing.

Optionally, the reaction product can be reacted with both organic compounds and water or aqueous solutions, sequentially or simultaneously to obtain conversion and stabilization along with hydrolyzation of the precursors.

Within the scope of the present invention, the term "precursor" is used to designate any compound, which contains the metal of the metal oxide material in such a form that the metal atom is capable of reacting during the subsequent processing stages by forming a metal oxide network.

The intermediate product is capable of polymerizing to form a film. In particular, the intermediate product is capable of polymerizing under the influence of heat and optionally evaporation of solvent. Other ways of polymerizing the intermediate product (prepolymer) include the use of radiation and photoinitiators (photopatterning capability). Also thermal initiators can be used.

Thus, the intermediate product is capable of polymerizing to form a cross-linked polymer having a (weight average)

molecular weight in excess of 5,000 g/mol and up to 250,000 g/mol. Typically, the reaction product therefore comprises a prepolymer having a (weight average) molecular weight of 200 to 5000 g/mol.

According to the present invention, the metal oxide precursor is preferably selected from the group of metal halogenides having the formula I $$MeX_m, \qquad \text{I}$$

wherein Me stands for a metal, X stands for a halogenide and m represents the valence of the metal,
metal alkoxides, having the formula II $$MeOR^1_m, \qquad \text{II}$$

wherein $R^1$ stands for a linear or branched, aliphatic or alicyclic alkyl group, which optionally is substituted by 1 to 3 substitutents selected from the group consisting of hydroxy, carboxy, anhydride, oxo, nitro and amido groups, and Me and m have the same meaning as above,
metal compounds having the formula III $$X_n MeOR^1_p, \qquad \text{III}$$

wherein Me, X and $R^1$ have the same meaning as above and n is an integer 0 to m,
p is an integer 0 to m, and the sum of n+p is equal to m, m having the same meaning as above,
and mixtures thereof.

In the above formulas, Me is preferably selected from the group consisting of germanium, titanium, tin, antimony, tantalum, hafnium and zirconium. X is preferably a chloride. Any alkoxide is suitable, but preferably methoxides, ethoxides, propoxides or butoxides are used due to their reactivity.

As noted above, the metal oxide precursor can comprise one single metal oxide precursor or it can comprise two or more metal halogenides of the formula I or metal alkoxides having the formula II, having different metal elements Me, or a two or more metal compounds of formula III, or mixtures of the precursors of formulas I to III. In the embodiment, where the precursor comprises different metals, the metal oxide precursor comprises, for example, a second metal oxide precursor having the formulas I or II, wherein the metal stands for lanthanum, indium or lead. Naturally, mixtures of metal oxide halogenides/alkoxides of the above groups of germanium, titanium, tin, antimony, tantalum, hafnium, zirconium and silicon can also be employed. The metal oxide precursor may also comprise a metal halogenide or metal alkoxide, which in itself contains two different metal atoms.

In some cases it can be preferable to start out the synthesis by reacting first together two metal oxide precursors having the same metal elements Me and then continuing the reaction with their reaction product. In this case e.g. metal halogenides can be reacted with metal alkoxides to result in a "starting" metal oxide precursor having a formula (III) as described above. In this case also different metal elements Me can be used. This approach may be preferable e.g. in some cases the metal oxide precursors are very poorly soluble in common solvents and this way the "starting" metal oxide precursor can be made more soluble and this way the further synthesis can be carried out more easily.

Furthermore, the metal oxide precursor may comprise a second metal oxide precursor containing nitride or silicide groups.

In case of some metal oxide precursors it is necessary to use an organic compound to stabilize the prepolymerized material. The organic compound is capable of stabilizing the metal oxide precursor to the extent that it does not form a fully cross-linked polymer matrix, which would not be solvable in any suitable processing solvent. In general, the organic compound needs to be reactive with the metal element used in the synthesis and to be able to stabilize the metal oxide precursors so that they do not form a fully cross-linked "jelly" type polymer matrix, which is not soluble in processing solvent. Within the scope of the present invention, the term "reactive" means that the organic compound is capable of forming a chemical compound or a chemical complex with the metal oxide precursor. For that purpose, the organic compound should have at least one, preferably 1 to 3, functional groups capable of reacting with the metal oxide precursor. Examples of such groups are carboxy, carboxylic anhydride, oxo, amide and nitro groups. A further feature is that the organic compound may contain groups, which can induce cross-linking reactions during an annealing or polymerization stage. For example, the organic compound may contain carbon-carbon double bonds, that enable the photopatternability of the material.

In the below example (cf. the example titled "Titanium oxide hybrid polymer 1"), methacrylic acid is used, but the invention is not limited to such stabilizing and complexing organic compounds. Preferably, the organic compound can be any organic compound selected from the group consisting of organic acids, acid anhydrides, alkoxides, ketones, beta-diketones, acetyl acetones, benzyl acetones, aryl oxides, beta-keto-esters, alkanol amines, glycols, oximes, alkyl hydroxyl amines, beta-keto-amines, Shiff-bases, thiols and aldehydes. Therefore, examples of suitable organic compounds include, but are not limited to, acetic acid, acrylic acid, methacrylic acid, trifluoroacetic acid. Further examples are formed by ketones, such as acetone, and beta-diketone, and aldehydes.

During the reaction, the molar ratio between the metal oxide precursor and the organic compound is about 10:1 . . . 1:10, preferably about 5:1 to 1:5. Suitably, the molar amount of the organic compound is at least equal to the valences of the metal in the metal oxide precursor.

After the reaction, the reaction product (prepolymer) is recovered. The suitable processing solvent for the reaction product depends on the used metal oxide and optional organic compound. It is possible to process the reaction product from the used reaction solvent. It is possible to recover the reaction product in the reaction solvent and dissolve it into an organic or aqueous solvent having boiling point higher than reaction solvent by solvent displacement. It is also possible to evaporate off the reaction solvent of the reaction product to obtain an dry or semi-dry product, which can be dissolved in a solvent suitable for the subsequent film forming processing step. As an example processing solvents such as alcohols (2-isopropoxyethanol, methanol, ethanol, isopropanol, n-butanol) and cyclic ethers (gamma butyrolactone). Furthermore, solvent mixtures can be used as processing solvent. The coating composition contains about 0.001 to 10 moles/l of the reaction product. Generally, the concentration of the reaction product in the liquid composition is about 0.1 to 60 wt-%, in particular about 5 to 50 wt-%.

The solution obtained (either aqueous or in an organic solvent) can be used as such for deposition by, e.g. liquid phase spin-on deposition, spray, ink-jet, dip-coating, roller, gravure, curtain, screen printing, menicus coating and flexographic coating methods, but are not limited to these.

Generally, the reaction product can be processed from liquid phase to result in film thicknesses ranging from 1 nm to 1000 nm with a single deposition run. If high processing temperatures are required, the film thickness is preferably below 500 nm to prevent film failure due to cracking.

The concentration of the composition during application depends on the target thickness of the film. By diluting the composition, it becomes possible to form thinner films. Generally, a solid concentration of about 5 to 40 wt-% is preferred.

A thin film layer of the metal oxide material thus formed can be annealed at selected curing temperature to result in high refractive index coating or structure. Thus, to mention an example, for titanium oxide hybride materials, a refractive index of 1.94 (typically 1.9 or higher) can be achieved at a temperature of 150° C., and when the temperature is increases to 350° C., a refractive index of 2.03 (typically 2.0 or higher) can be achieved.

Generally, when the thin layer is annealed at a temperature in the range of 80 to 350° C. a metal oxide film is produced, which contains at least some residues of the organic compound.

However, when the organic compound contains radiation sensitive carbon double bonds polymerization of the intermediate product can also be carried out by photo-crosslinking, as discussed above.

Depending on the application the formed film can also be annealed at very high temperatures (400 to 1000° C. or higher) to fully remove the organic compound (e.g. methacrylic acid) from the film leading to formation of a metal oxide thin film.

The hybrid metal oxide materials described herein can be patterned using UV-lithography, embossing, hot-embossing, UV-embossing, flash and print, nano-imprinting, roll-to-roll printing and gravure printing.

Since the materials can be cured at low temperature during the processing the use of various substrates types, such as plastics and paper, is possible.

Summarizing, it can here be noted that the present coating (film-forming) compositions according to the invention can be used for forming a photonic crystal device on a substrate to be applied in OLEDs.

Metaloid Oxide Low Index Polymers

The second component of the photonic crystal device is a layer of low or relatively low refraction index. Such a layer preferably comprises a siloxane material.

Within the scope of the present invention, siloxanes stand for saturated silicon-oxygen hydrides with unbranched or branched chains of alternating silicon and oxygen atoms, each silicon atom being separated from its nearest silicon neighbours by single oxygen atoms. The general structure of unsubstituted, unbranched siloxanes is

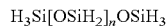

$H_3Si[OSiH_2]_nOSiH_3$

Unsubstituted, branched siloxanes are represented by the formula

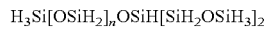

$H_3Si[OSiH_2]_nOSiH[SiH_2OSiH_3]_2$

The present invention also encompasses substituted siloxanes as well as the corresponding germanium compounds. Thus, generally, the invention comprises (organo)metalloid oxide materials, which have a repeating -M-O-M-O— backbone optionally with at least one organic substituent bonded to the backbone, the material having a molecular weight of from 500 to 1,000,000 g/mol, where M is silicon or germanium and O is oxygen. The preferred range of molecular weight is from about 1000 to 100,000 g/mol. The organic substitutents can be selected from aliphatic and aromatic groups, which optionally bear halogen, hydroxyl, carboxy, anhydride, oxo, nitro, and amido substituents. Examples include $C_{1-6}$ linear or branched alkyl, $C_{5-12}$-cycloalkyls and aryl groups having 1 to 5 rings.

In case of silicon or germanium based materials, the precursors can have the formulas IV or V below

$MeX'_4$                                                                  IV wherein Me stands for Si or Ge and each X' stands independently for hydrogen, halogenide or an unsubstituted or optionally substituted organic group, or

$X'_3Me-R_2-MeX'_3$                                   V wherein Me stands for Si or Ge, each X' has independently the same meaning as above and $R_2$ stands for an optional bivalent hydrocarbon linker, such as an alkenyl group —$CH_2$—, optionally carrying an organic substituent of the above kind.

In the meaning of X', the organic groups can be include $C_{1-6}$ linear or branched alkyl, $C_{1-6}$ linear or branched alkoxy groups, $C_{5-12}$-cycloalkyls and aryl groups having 1 to 5 rings.

The substituents can be selected from the above mentioned groups (halogen, hydroxyl, carboxy, anhydride, oxo, nitro, halogen and amido), but the substituent can also be an unsaturated group such as a vinyl group.

Mixtures of compounds of formulas I' and II' can also be used.

Specific examples of silane precursors include trichlorosilane, methyltrichlorosilane, chloromethyltrichlorosilane, chloroethyltrichlorosilane, trifluoropropyltrichlorosilane, allyltrichlorosilane and $Cl_2SiMeCH_2CH_2SiCl_3$.

The following non-limiting examples disclose the preparation of the new coating compositions:

Metal Oxide High Index Polymer

Figure 5:
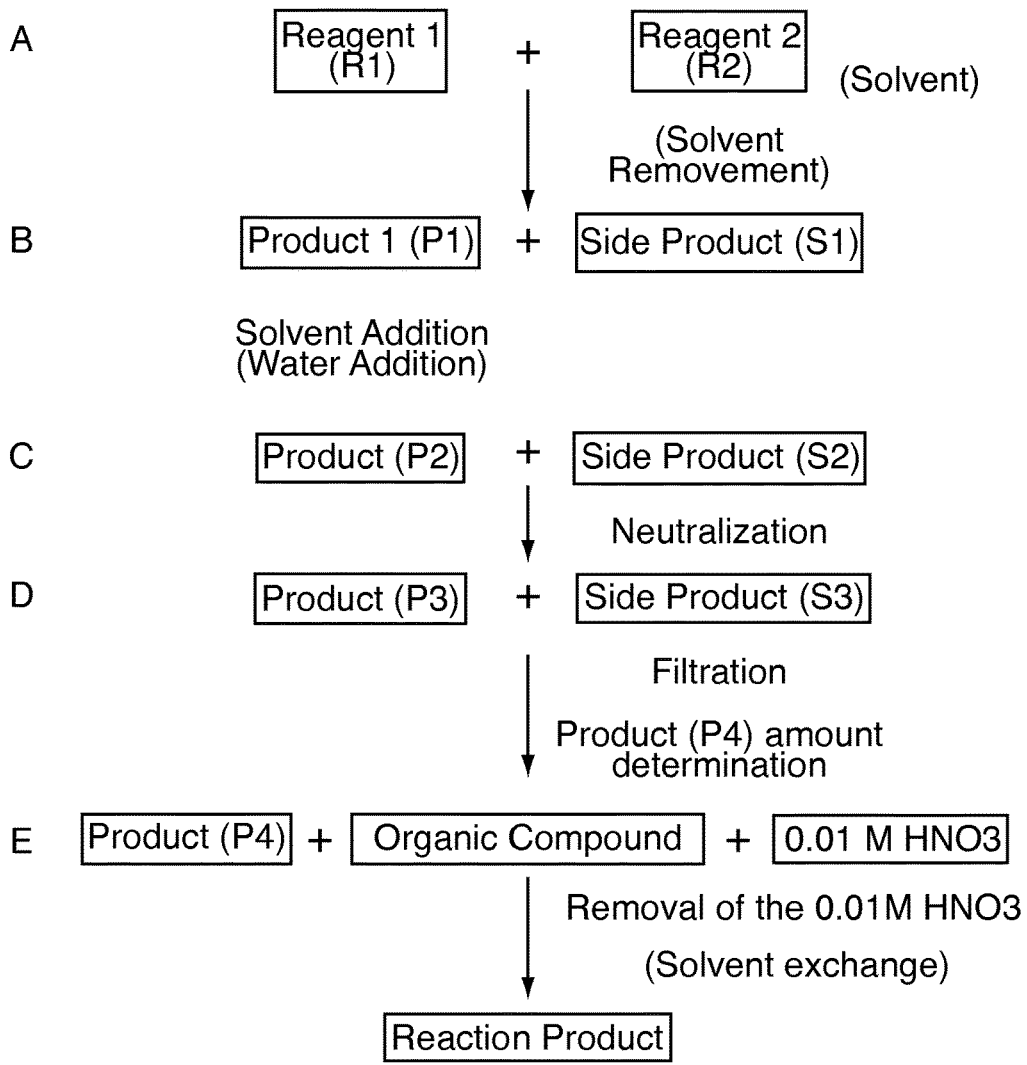
FIG. 5 depicts a synthesis processing scheme for a method producing the metal oxide material according to the present invention.

FIG. 5 gives a schematic depiction of the synthesis of the metal oxide hybrid polymers. This synthesis method can be used for the above mentioned metal oxide precursors, using one or two metal element Me precursors (same metal or different), pure halogenides or alkoxides or a combined precursor having both halogenides and alkoxides as ligands. The synthesis method varies from case to case depending on the precursors used (solubility, reactivity), need for neutralization procedure of the material, organic compound used and selection of the final processing solvent for the material (aqueous, organic).

In the following, the synthesis method flow is described first in general with reference to FIG. 5 and using titanium oxide as an example, and then with three detailed examples.

Step A:

In step A the starting reagents are reacted with each other. Reagents R1 and R2 can both be metal oxide precursors having different or the same metal element Me; they can be pure halogenides or alkoxides or combined precursors having both halogenides and alkoxides as ligands. The reaction can be carried out in an inert solvent, if preferred. In some cases the reaction can be carried out by using a metal element precursor as Reagent R1 and a reactive solvent (e.g. an alcohol) as Reagent R2. In such a case, if Reagent R1 is, e.g., titanium tetrachloride ($TiCl_4$) which is reacted with ethanol (EtOH, R2), Product 1 (P1) from this reaction is a "combined" substituted titanium precursor e.g. $TiCl_2(OEt)_2$. This reaction also produces hydrochloric acid HCl (S1) as a side product.

Typically if an inert solvent is used in step A it is removed once the Reagents R1 and R2 have reacted (before step B).

Step B:

Typically the Product 1 (P1) at this stage of the synthesis has the general formula $X_m MeOR^1_m$ or $X_m MeO_m MeOR^1_m$, wherein X, Me and $R^1$ have the same meaning as above.

Now the pre-reacted starting precursor can be dissolved in a solvent and reacted optionally already at this stage with organic compounds (to form different complexes), water or acidic water (to induce hydrolysis and condensation of the metal oxide precursors). In some cases where it is preferred to fully neutralize the material, and if Product 1 (P1) still contains halogenide ligands, the reaction of P1 is preferably continued further. This can be done e.g. by adding a stoichiometric amount of distilled water into the reaction mixture. For the materials mentioned above in Step A, this reaction produces a reaction Product (P2), based on the following equation:

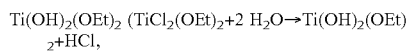
Ti(OH)$_2$(OEt)$_2$ (TiCl$_2$(OEt)$_2$+2 H$_2$O→Ti(OH)$_2$(OEt)$_2$+HCl, and a Side Product (S2), e.g. HCl.

Step C:

When halogenide metal precursors (e.g. chloride) are used in the reaction, reaction products (P2 and P3) are usually very acidic after steps A and B. This is due to the side products (S1 and S2, e.g. HCl) formed during the synthesis. The material can be neutralized at this point using, e.g., triethylamine (NEt$_3$) in the reaction. Other neutralization procedures can also be applied. NEt$_3$ reacts with HCl forming Et$_3$N.HCl (Side product S3). When the reaction is carried out in a suitable solvent, Et$_3$N.HCl precipitates out and can be removed using filtration.

Step D:

The material is filtrated using, e.g., pressure filtration or recirculation filtration.

Step E:

In some cases, at this stage the material is ready for use without the need of any further additives. It may be required to change the solvent used during the synthesis to a more suitable solvent for processing. This can be done using a solvent exchange procedure.

In some cases it is preferred for reasons of materials processing and stability to react the metal oxide material with organic compounds (to form different complexes and stabilize the material) and with acidic water (to induce hydrolysis and condensation of the metal oxide precursors). If organic compounds and acidic water are added, as a last step usually the acidic water is removed from the material using distillation. Also the synthesis solvent can be changed to a more suitable solvent for processing purposes. In some cases it may be preferable to add surfactants to the final material solution to achieve perfect film quality in deposition.

Polymer Example I: Titanium Oxide Hybrid Polymer 1

Ti(iOPr)$_4$ (0.05277 mol) was placed in a round bottom flask. TiCl$_4$ (0.05277 mol) was added by syringe and needle. The solution containing a white solid was stirred at room temperature (RT) for 10 min. 125.04 g of 2-isopropoxyethanol was added and the clear yellow solution was stirred at room temperature for 30 min. (Nd=1.4332). 3.80 g of H$_2$O (0.21099 mol) was added and the reaction solution was stirred at room temperature for an additional 5 min (Nd 1.4322). 21.36 g of TEA (0.211088 mol) was added to neutralize the reaction mixture. The obtained white suspension was stirred at room temperature for 2 h. The white reaction suspension was filtrated using pressure filter (filter paper size 0.45 um) Nd=1.4235 and pH=6.5-7 (pH-paper was used for determination). The amount of material in grams after filtration was 92.71 g. An acidic water solution (nitric acid, HNO$_3$, 0.0652 mol) was added to the reaction mixture. Then, metacrylic acid (MAA, 0.1304 mol) was added dropwise after a few minutes. The reaction mixture was stirred at room temperature over night. Finally, the acidic water was removed by using rotary evaporator [evaporation, pressure=77 mbar, t(bath temp)=48° C., t=10 min. pH=5.01, Nd=1.4255]. The material thus obtained was ready for deposition.

Polymer Example II: Tantalum Oxide Hybrid Polymer 1

TaCl$_5$ (0.007342 mol) was placed to a round bottom flask and methanol (MeOH) (26 ml) was added. To the clear reaction solution Ta(OEt)$_5$ (0.007342 mol) was added. The clear reaction solution was stirred at room temperature for 2 h. Solvent exchange from MEOH to 2-isopropoxyethanol (5×) was carried out using rotary evaporator (p=200-51 mbar, tbath=40° C.). The clear reaction solution was stirred at room temperature for a few minutes and after that the reaction solution was neutralized using TEA (m=4.62 g; 0.04566 mol). The white suspension was stirred at room temperature for 2 h and then filtrated using pressure filter (0.45 um). The clear solution obtained was placed in freezer overnight. After this the suspension was filtrated. The solvent used during the synthesis was removed by rotary evaporator (p=100-1 mbar, t(bath)=40° C., at 1 mbar for 10 min). 6.82 g of IPA:MeOH:1-butanol solution (6:3:1) was added as processing solvent to the material. Clear reaction solution had a pH of 7.14. The material was ready for deposition.

Polymer Example III: Tantalum Oxide Hybrid Polymer 2

TaCl$_5$ (0.04218 mol) was placed in a round bottom flask and MeOH (151.1 ml) was added. The clear reaction solution was stirred at room temperature for 2 h. Solvent exchange from MeOH to 2-isopropoxyethanol (5×) was carried out using rotary evaporator (p=200-50 mbar, t(bath=40° C.). The clear reaction solution was stirred at room temperature for a few minutes. The reaction solution was neutralized using TEA (m=14.82 g; 0.14646 mol). The white suspension was stirred at room temperature for 2 h and then filtrated using pressure filter (0.45 um). The slightly cloudy solution thus obtained was filtrated again using syringe and filter (0.45 um). The resulting clear solution was placed in freezer and kept there overnight. After this the suspension was filtrated again using a syringe filter (0.45 μm). The solvent was removed by rotary evaporator (p=100-1 mbar, t(bath)=40° C., at 1 mbar for 10 min). 240 wt-% of an MEOH:1-butanol solution (1:1) was added as a processing solvent. A clear reaction solution was obtained (pH=7.1). The material was ready for deposition.

Metaloid Oxide Low Refractive Index Polymer

Figure 6:
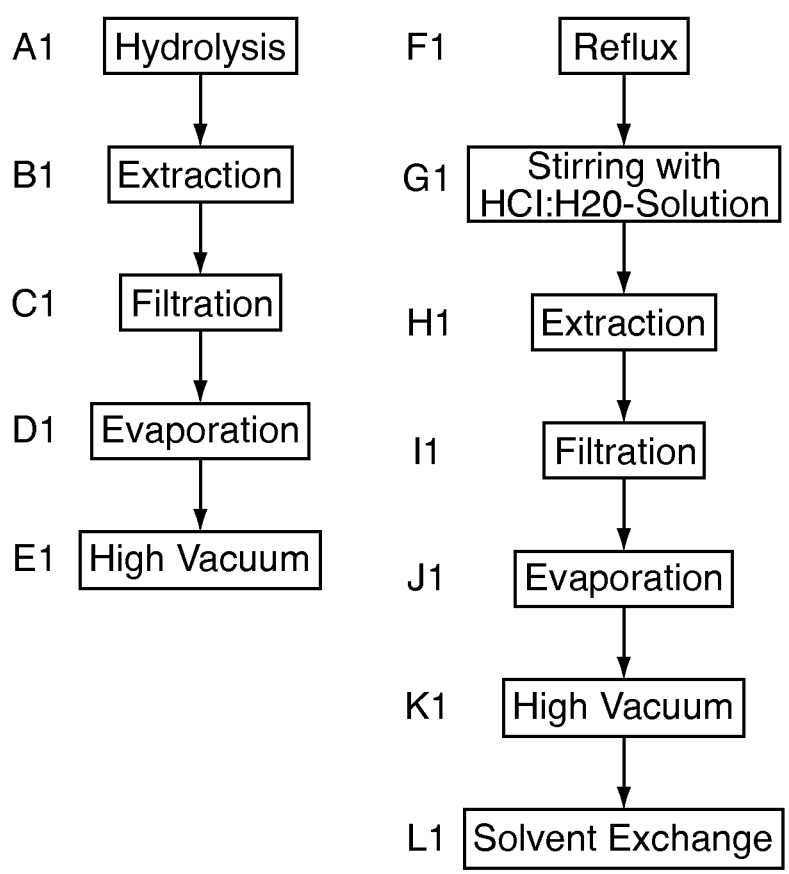
FIG. 6 depicts a synthesis processing scheme for a method producing the metalloid oxide material according to the present invention.

FIG. 6 gives a schematic depiction of the synthesis of the metalloid oxide polymers. This synthesis method can be used for the above mentioned metalloid oxide precursors, using one or two Si or Ge precursors (same metal or different), pure halogenides or alkoxides or a combined precursor having both halogenides and alkoxides as ligands. The synthesis method may vary from case to case depending on the precursors used. A general synthesis method flow is described below. The examples below are described using silane precursors.

In the following, the synthesis method flow is described first in general with reference to FIG. 6. After the general description two detailed examples are represented.

The synthesis of the metalloid oxide materials is carried out by using two synthesis phases. In the first phase (step A→step E, see FIG. 6) the silane precursor molecules (tetra-, tri-, di-, or mono-functional silanes; halogenides, alkoxides etc) are hydrolyzed and condensed to form a relatively low molecular weight prepolymer. It may be preferable in some cases to use basic or acidic conditions during the hydrolysis. With some precursors and compositions it is possible that already at this synthesis stage the material may have a suitable molecular weight and properties to be used as the final material, and after addition of processing solvent (if needed) ready for film deposition and patterning. In the second phase (step F→step L, see FIG. 6) the obtained low molecular weight prepolymer is further condensation polymerized in the presence of a suitable catalyst. In the second phase the molecular weight of the prepolymer is increased to facilitate suitable properties of the material and film deposition and processing.

As described above the properties of the metalloid oxide material can be tuned by selection of suitable precursor molecules for the metalloid oxide material synthesis. By selection of the suitable synthesis conditions and method each precursor molecule set (composition) can be polymerized properly to result in desired material properties, processability and stability. As already mentioned the synthesis conditions and method will vary depending of what type of silane precursors (halogenides, alkoxides) are used. Also the attached organic functionalities in organosilane precursors will affect the synthesis conditions.

Step A1:

In step A1 all the used precursor molecules are dissolved in an inert solvent or solvent mixture. The used precursor molecules can be metalloid oxide precursors having different or the same Si or Ge element; they can be pure halogenides or alkoxides or combined precursors having both halogenides and alkoxides as ligands; the precursors may be also organo-functionalized carrying a selected organic functionality covalently bonded to the Si or Ge. It is possible to carry out the hydrolyzation also without using any solvent, but use of a solvent is preferred. The precursor molecules can be delivered to the reaction vessel at the same time or they can be added separately in certain steps. The reaction can be carried out in basic, neutral or acidic conditions in the presence of catalyst. The hydrolysis of the precursors may be done in presence of water (excess of water, stoichiometric amount of water or sub-stoichiometric amount of water). The use of water is not necessary in all cases. Heat may be applied during the reaction and refluxing can be used during the reaction. With some precursors if condensation is preferred to proceed already at this stage of the synthesis it may be preferable to remove the formed water during the condensation reaction. Typically the solvent used in the synthesis also affects the properties of the produced prepolymer. A suitable solvent should be selected that dissolves well all the used precursor molecules and has a suitable boiling point if refluxing is applied during the reaction.

Step B1:

If the reaction in step A1 was carried out using halogenide precursor molecules, inert solvent and excess of water usual procedure after step A is extraction. The extraction in this case can be carried out using water. During the extraction all the formed hydrochloric acid during step A is dissolved in the water phase and the material dissolved in the inert solvent is neutralized. The inert solvent has to be selected to be such that it is not miscible with water so that extraction is possible. After the inert solvent phase is neutralized the water and solvent phases are separated and solvent phase is taken for step C1.

Step C1:

The extracted solvent phase is usually filtrated since some precipitation or gel formation may happen during the synthesis step A1 and extraction step B1.

Step D1 and Step E1:

In this step the reaction solvent(s) and formed by products such as water, alcohols, HCl etc. are removed and prepolymer is obtained. As mentioned above with some precursors and compositions it is possible that already at this synthesis stage the material may have a suitable molecular weight and properties to be used as the final material, and after addition of processing solvent (if needed) ready for film deposition and patterning.

Step F1:

In step F1 the low molecular weight prepolymer produced during step A1→Step E1 is further condensation polymerized. The polymerization can be carried with or without solvent, but is it preferable to use at least small amount of solvent during the reaction. The used solvent should be such that it well dissolves the prepolymer material leading to homogenous reaction conditions. A mixture of solvents can be also used. A catalyst can be used during the reaction to facilitate the condensation polymerization. Heat can be applied during the reaction and in some cases it is preferable to remove the formed water from the reaction vessel during the synthesis to enhance the condensation polymerization. As a result from step F1 the metalloid oxide material molecular weight is increased to facilitate suitable properties of the material and film deposition and processing.

Step G1:

This step is applied if example amine catalyst is used during step F1. The $HCL:H_2O$ solution is used to remove the amine from the produced metalloid oxide material.

Step H1:

This extraction step H1 applied if Step G1 is used. Extraction removes all the added hydrochloric acid and amine from the material. The extraction is carried out using water and the material dissolved in the inert solvent is neutralized. The inert solvent has to be selected to be such that it is not miscible with water so that extraction is possible. After the inert solvent phase is neutralized the water and solvent phases are separated and solvent phase is taken for step I1.

Step I1:

The extracted solvent phase is usually filtrated since some precipitation or gel formation may happen during the synthesis step F1 and extraction steps G1 and H1.

Step J1 and Step K1:

In this step the reaction solvent(s) and formed by products such as water, alcohols etc. are removed and final metalloid oxide polymer is obtained.

Step L1:

The processing solvent (if needed) may be added to the material by using a solvent processing solvent exchange procedure or added to the formed solvent free metalloid oxide polymer. In some cases it may be preferable to add surfactants to the final material solution to achieve perfect film quality in deposition. The material is now ready for the film deposition and patterning.

Polymer Example IV: Siloxane Material 1

Trifluoropropyltrichlorosilane (26.38 g, 0.1139 mol) and allyltrichlorosilane (13.32 g, 0.07596 mol) were weighed to a round bottom flask. 183 g of dichloromethane (DCM) was added. This clear DCM solution was added using a dropping funnel to another flask in an ice bath containing a DCM:$H_2O$ solution 23 ml:160 ml. The DCM solution was added in 60 min. The temperature was maintained during addition between 2-5° C. After addition, the reaction mixture was stirred at room temperature (RT) for 120 min. After this the reaction mixture was placed in a separation funnel and 120 g of DCM was added. The DCM and $H_2O$ layers were separated. The DCM phase was extracted six (6) times using 65 ml of distilled water in each extraction run. The pH of the DCM-phase was, after the last extraction, neutral. The DCM-layer was filtrated once using a filter paper. DCM was removed by evaporation (p=400-2 mbar, T(bath)=40° C.). The vacuum was maintained below 18 mbar for 5 min. After this, the clear material was kept under high vacuum (p=1-2 mbar) for 60 min. 44.74 g of methyl tert.-butylether (MTBE) and 44.78 g of p-xylene was added to the material. The material was allowed to dissolve in the solvents overnight. 0.65 g of triethylamine (TEA) was added to this solution. The solution of the materials was refluxed for 90 minutes using a refluxing system designed to circulate the solvents in the system. 44.90 g of HCl:$H_2O$ (1:5) was added to the material and stirred for 30 min. The solution was transferred to a separation funnel. 134 g of MTBE was added. The MTBE-xylene phase was extracted six (6) times using 65 ml of distilled water. The pH of the water layer after the last extraction step was neutral. The MTBE-xylene layer was filtrated once using filter paper. MTBE was removed by evaporation using p=300-250 mbar, T(bath=40° C., rot=130 rpm. 24.70 g of PGMEA was added. Rest of the solvents were removed by evaporation using p=250-10 mbar, t(bath)=40-70° C., rot=130-20 rpm.

The clear material was kept under high vacuum (p=1-2 mbar) for 60 min. 130 wt-% of propyleneglycol monomethylether acetate (PGMEA), 300 wt-% of ethyl lactate and 1 wt-% of BYK-306 were added to the material and stirred over a night. The material was ready for use.

Polymer Example V: Siloxane Material 2

Trifluoropropyltrichlorosilane (26.38 g, 0.1139 mol), allyltrichlorosilane (10.0 g, 0.05697 mol) and $Cl_3SiMeCH_2CH_2SiCl_3$ (5.25 g, 0.01899 mol) were weighed into a round bottom flask. 191 g of DCM was added. This clear DCM solution was added using a dropping funnel to another flask in ice bath containing DCM:$H_2O$ solution 24 ml:167 ml. The DCM solution was added in 60 min. Temperature during addition was 2-4° C. After addition, the reaction mixture was stirred at room temperature for 120 min. The reaction mixture was placed in a separation funnel and 100 g of DCM was added. DCM and H20 layers were separated. The DCM phase was extracted six (6) times using 65 ml of distilled water in each extraction run. The pH of the DCM-layer after the last extraction was neutral. DCM-layer was filtrated once using a filter paper. DCM was removed by evaporation using p=400-7 mbar, T(bath)=40° C. and rot=130-20 rpm. The clear material thus obtained was kept under high vacuum (p=1 mbar) for 60 min. 45.38 g of MTBE and 47.64 g of p-xylene were added to the material. The material was allowed to dissolve overnight. 0.67 g of TEA was added to the solution. The solution was refluxed for 90 minutes using a refluxing system designed to circulate the solvents in the system. 47.0 g of a HCl:$H_2O$-solution (1:5) was added to the material and stirring was continued for 30 min. The solution was placed in a separation funnel. 140 g of MTBE was added. The MTBE-xylene phase was extracted six (6) times using 65 ml of distilled water. The pH of water layer after last extraction was neutral. The MTBE-xylene phase was filtrated once using a filter paper. MTBE was removed by evaporation using p=300-250 mbar, T(bath=40° C., rot=130 rpm. 24.88 g of PGMEA was added. The rest of the solvents were removed by evaporation using p=250-5 mbar, T(bath)=40-70° C., rot=130-20 rpm. The clear material thus obtained was kept under high vacuum (p=0 mbar) for 60 min. 130 wt-% of PGMEA, 300 wt-% of ethyl lactate and 1 wt-% of BYK-306 were added to the material and stirred over a night. The material was ready for use.

Alternatively, the low refractive index layer(s) can be made by utilizing commercial fluoropolymers such as Zytop and fluorinatated polyimides that maybe also directly photo-patternable (but not limited to these) or alternatively fluorinated or non-fluorinated siloxane polymers or CVD oxides of fluorosilicate glasses that can be processed via conventional lithographic masking and etching processes.

Material Processing and Characterization
Processing (Example of Spin-on Deposition)
Metal Oxide High Refractive Index Polymers For characterization purposes, the above-described metal oxide polymers (Polymer examples I, II and III) were used as optical thin films and, thus, the films were deposited on p-type 4" silicon substrates by applying the spin-on processing method. The solution was poured on a static substrate after which the material was spun on the wafer in four (3) stages: first the solution was spread on the substrate at 50 rpm speed for 10 seconds, then at 100 rpm speed for 10 seconds and finally at 1500 rpm for 30 seconds. Edge bead removal (5 mm removal from the wafer edge) and backside rinse were accomplished manually using 2-propanol as a rinsing solvent. The film curing after spin coating was performed in two steps. Initial film pre-bake was done at 130 C for 5 minutes using a conventional open-air laboratory hot plate with ±2° C. temperature uniformity over the plate. After this the films were cured in oven (nitrogen atmosphere) using the following temperature cycle: A) 30 minutes ramping to 250° C.; B) 60 minutes bake at 250° C.; C) 30 minutes ramping to 400° C.; D) 60 minutes bake at 400° C.; E) 90 minutes ramp down to room temperature. The optical characterization measurements of the cured films were carried out using an ellipsometer.

Metalloid Oxide Low Refractive Index Polymers

For characterization purposes the above-described metalloid oxide polymers (Polymer examples IV and V) were used as optical thin films and, thus, the films were deposited on p-type 4" silicon substrates by applying the spin-on processing method. The solution was poured on a static substrate after which the material was spun on the wafer in four (3) stages: first the solution was spread on the substrate at 50 rpm speed for 10 seconds, then at 100 rpm speed for 10 seconds and finally at 1500 rpm for 30 seconds. Edge bead removal (5 mm removal from the wafer edge) and backside rinse were accomplished manually using acetone as a rinsing solvent. The film curing after spin coating was performed in two steps. Initial film pre-bake was done at 130° C. for 5 minutes using a conventional open-air laboratory hot plate with ±2° C. temperature uniformity over the plate. After this the films were cured in oven (nitrogen atmosphere) using following temperature cycle: A) 30 minutes ramping to 250° C.; B) 60 minutes bake at 250° C.; C)

30 minutes ramping to 400° C.; D) 60 minutes bake at 400° C.; E) 90 minutes ramp down to room temperature. The optical characterization measurements of the cured films were carried out using an ellipsometer.

Film Characterization:

The film thickness, refractive index and extinction co-efficient (k) measurements were performed by using SCI FilmTek 4000, which is a spectrophotometry-based metrology tool (see summary of data in Table 1). The spectral optical data was acquired from 450 nm to 1700 nm.

The stability of the cured films was characterized using an etching test with potassium hydroxide KOH 10-w % (weight percent) solution at 50° C. for 5 minutes. All the films had good etch resistance against the KOH solution without any changes in optical properties or morphology of the films. Adhesion on substrates, e.g. p-type silicon, glass and plastics (polypropylene, PMMA, polycarbonate) was also found to be good.

Table 1 summarizes the refractive indices and k-values for the above mentioned metal oxide polymers (Polymer examples I, II and III) and metalloid oxide polymers (Polymer examples IV and V).

TABLE 1

Refractive indices and extinction co-efficient (k) values (at 632.8 nm) for the metal and metalloid oxide polymer films.

| Polymer material | Film thickness (nm) | Extinction co-efficient (k) at 632.8 nm | Refractive index at 632.8 nm |
| --- | --- | --- | --- |
| Polymer example I | 70 nm | k = 0.01573 | n = 2.12291 |
| Polymer example II | 120 nm | k = 0.0007 | n = 2.0017 |
| Polymer example III | 96 nm | k = 0 | n = 2.0012 |
| Polymer example IV | 495 nm | k = 0 | n = 1.37959 |
| Polymer example V | 303 nm | k = 0 | n = 1.38129 |

Alternative Processing Methods

As described above, the present materials can be used as optical or electrical coatings but also patterned for example using lithography, embossing, roll-to-roll printing and gravure printing. More specifically, the material wherein carbon double bonds exists can be exposed to UV or deep-UV light and thus carbon double bond reacts and cross-links and making the exposed parts non-dissolvable to an organic solvent (developer such as isopropanol). Therefore, the material is behaving as a negative type resist in the lithographic process.

Worked Device Example

Fabrication of a micro-optical photonic crystal structure on top of glass substrate based on FIG. 3 configuration:

The photonic crystal structure in this case consist include a higher refractive index layer 315, low refractive index layer 320 and patterned low refractive index layer 325. Fabrication of the structure begins by carefully cleaning the glass substrate using acetone, ethanol and isopropanol immersion for 5 min, respectively, in ultrasonic bath. After cleaning the substrate, the high refractive index material (polymer example III) is deposited on top. This was done by applying the spin-on deposition method. The solution was poured on a static substrate after which the material was spun on the wafer in four (3) stages: first the solution was spread on the substrate at 50 rpm speed for 10 seconds, then at 100 rpm speed for 10 seconds and finally at 1500 rpm for 30 seconds. Edge bead removal (5 mm removal from the wafer edge) and backside rinse were accomplished manually using acetone as a rinsing solvent. The film curing after spin coating was performed in two steps. Initial film pre-bake was done at 130° C. for 5 minutes using a conventional open-air laboratory hot plate with ±2° C. temperature uniformity over the plate. After this the films were cured in oven (nitrogen atmosphere) using following temperature cycle: A) 30 minutes ramping to 250° C.; B) 60 minutes bake at 250° C.; C) 30 minutes ramping to 400° C.; D) 60 minutes bake at 400° C.; E) 90 minutes ramp down to room temperature.

Prior to deposition of the next layer the deposited and cured high refractive index layer surface may be treated using a plasma asher (e.g. 300 W, Argon and Oxygen gases for 3 minute) and optionally an adhesion promoter [e.g. a dilute water solution containing (3-aminopropyl)triethoxysilane] can be used to improve the adhesion of the low refractive index material to the high refractive index material layer below.

After this the low refractive index layer (polymer example V) is deposited on top of the high refractive index layer. This was done by applying the spin-on deposition method. The solution was poured on a static substrate after which the material was spun on the wafer in four (3) stages: first the solution was spread on the substrate at 50 rpm speed for 10 seconds, then at 100 rpm speed for 10 seconds and finally at 1500 rpm for 30 seconds. Edge bead removal (5 mm removal from the wafer edge) and backside rinse were accomplished manually using 2-propanol as a rinsing solvent. The film curing after spin coating was performed in two steps. Initial film pre-bake was done at 130° C. for 5 minutes using a conventional open-air laboratory hot plate with ±2° C. temperature uniformity over the plate. After this the films were cured in oven (nitrogen atmosphere) using following temperature cycle: A) 30 minutes ramping to 250° C.; B) 60 minutes bake at 250° C.; C) 30 minutes ramping to 400° C.; D) 60 minutes bake at 400° C.; E) 90 minutes ramp down to room temperature.

Prior to deposition of the next layer the deposited and cured high low refractive index layer surface may be treated using a plasma asher (e.g. 300 W, Argon and Oxygen gases for 3 minute) and optionally an adhesion promoter [e.g. a dilute water solution containing (3-aminopropyl)triethoxysilane] can be used to improve the adhesion of the next low refractive index material layer to the low refractive index material layer below.

After this the second low refractive index layer (polymer example V) is deposited on top of the high refractive index layer and patterned using lithographic patterning. The same low refractive index material (polymer example V) is used. As a difference to the previous layer 320 is that the material used here contains photoinitiator molecules (3 wt % Irgacure 819) that facilitate the polymerization of the deposited material film under UV exposure. The material works as a negative tone resist material, meaning, the material is polymerized in areas where exposed and become insoluble in used developer solution. The processing is done as follows. First the low refractive index material is deposited on top of the previous layer 320 using the spin-on deposition method. The solution was poured on a static substrate after which the material was spun on the wafer in four (3) stages: first the solution was spread on the substrate at 50 rpm speed for 10 seconds, then at 100 rpm speed for 10 seconds and finally at 1500 rpm for 30 seconds. Edge bead removal (5 mm removal from the wafer edge) and backside rinse were accomplished manually using acetone as a rinsing solvent.

After spin coating the film is pre-baked on a hot-plate at 115° C. for 2 minutes. After this the pre-baked material film is UV-exposed using a designed photomask to produce the desired micro-optical photonic crystal structure. MA6 mask aligner is used to align the photomask respect with the substrate and exposure was carried out in a soft contact exposure mode. The used exposure intensity was 14 mJ/cm² and exposure time was 20 s. After exposure the film was developed in developer (3:1, isopropanol: methylisobutylketone solution) for 2 minutes producing the patterned low refractive index layer 325. After the development the films are cured in oven (nitrogen atmosphere) using following temperature cycle: A) 30 minutes ramping to 250° C.; B) 60 minutes bake at 250° C.; C) 30 minutes ramping to 400° C.; D) 60 minutes bake at 400° C.; E) 90 minutes ramp down to room temperature.

After fabricating the micro-optical photonic crystal structure the subsequent OLED device layer are deposited on top finalizing the device represented in FIG. 3.

Using the same processing principles of these materials all the other non-limiting represented device structures (FIG. 2 and FIG. 4) can be realized. Is the metal oxide high refractive index polymers are made photopatternable it is possible lithographically pattern also the high refractive index layer in the device structure. Thicknesses of the material layer and patterned structures can be tuned by the used synthesis procedure and material composition and used processing solvent and dilution and used deposition conditions.

In addition to spin-on deposition and lithographic patterning the photonic crystal structures can be optionally produced using other deposition and patterning methods. The photonic crystal layers deposition can be carried out by spin-on, spray, ink-jet, roller, gravure, flexographic, curtain and screen printing coating methods, but are not limited to these. The patterning of the photonic crystal layers can be done via direct lithographic patterning (meaning all the optical material layers described above can be made photosensitive and patterned as negative tone materials using lithography), conventional lithographic masking and etching procedure, imprinting and embossing, but are not limited to these.

While the present invention has been illustrated and described with respect to a particular embodiment thereof, it should be appreciated by those of ordinary skill in the art that various modifications to this invention may be made without departing from the spirit and scope of the present invention.

What is claimed is:

1. A method of making a photonic crystal device, comprising the steps of
providing a substrate consisting of glass, plastic, silicon, or ceramic;
depositing directly on the substrate in a single step a metal oxide polymer in the liquid phase and heating to remove the solvent and form a continuous first layer consisting of a first optical material having only a single first index of refraction at a wavelength of 632.8 nm;
depositing directly on only the first layer in a single step a metalloid oxide polymer in the liquid phase and heating to remove the solvent and form a continuous second layer consisting of a second optical material having only a single second index of refraction at a wavelength of 632.8 nm, which is lower than that of the first optical material; and
depositing directly on only the second layer in a single step a metalloid oxide polymer in the liquid phase and heating to remove the solvent and form a continuous third layer consisting of a third optical material having only a single third index of refraction at a wavelength of 632.8 nm;
wherein
the single index of refraction of the first optical material is 1.9 or higher at a wavelength of 632.8 nm;
the single index of refraction of the second optical material is 1.4 or less at a wavelength of 632.8 nm; and
the single index of refraction of the third optical material is 1.4 or less at a wavelength of 632.8 nm;
wherein the second layer does not contact the substrate and the third layer does not contact the first layer.

2. The method according to claim 1, wherein
the metal oxide polymer is made from a compound selected from the group consisting of
metal halogenides having the formula I $$MeX_m, \qquad \text{I}$$

wherein Me stands for a metal, X stands for a halogenide and m represents the valence of the metal,
metal alkoxides, having the formula II $$Me(OR^1)_m, \qquad \text{II}$$

wherein $R^1$ stands for a linear or branched, aliphatic or alicyclic alkyl group, which optionally is substituted by 1 to 3 substituents selected from the group consisting of hydroxy, carboxy, anhydride, oxo, nitro and amido groups, and Me and m have the same meaning as above,
metal compounds having the formula III $$X_nMe(OR^1)_p, \qquad \text{III}$$

wherein Me, X and $R^1$ have the same meaning as above and n is an integer 0 to m, p is an integer 0 to m, and the sum of n+p is equal to m, m having the same meaning as above,
and mixtures thereof.

3. The method according to claim 2, wherein in the above formulas, Me is selected from the group consisting of germanium, titanium, tin, antimony, tantalum, hafnium, zirconium and silicon.

4. The method according to claim 2, wherein $R^1$ stands for a linear or branched alkyl group having 1 to 6 carbon atoms.

5. The method of claim 2 which consists of the steps of
providing the substrate;
depositing directly on the substrate in a single step a metal oxide polymer in the liquid phase and heating to remove the solvent and form the first layer;
depositing directly on the first layer in a single step a metalloid oxide polymer in the liquid phase and heating to remove the solvent and form the second layer; and
depositing directly on the second layer in a single step a metalloid oxide polymer in the liquid phase and heating to remove the solvent and form the third layer.

6. The method according to claim 1, wherein the first optical material is a titanium oxide polymer, a tantalum oxide polymer or mixtures thereof.

7. The method according to claim 1, wherein the second optical material is an organosiloxane polymer.

8. The method according to claim 1, wherein the metalloid oxide polymer is made from a silicon or germanium based material having the formula $$MeX'_4 \qquad \text{IV}$$

wherein Me stands for Si or Ge and each X' stands independently for hydrogen, halogenide or an unsubstituted or optionally substituted organic group, or

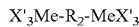   V wherein Me stands for Si or Ge, each X' has independently the same meaning as above and $R_2$ stands for an optional bivalent hydrocarbon linker, such as an alkenyl group —$CH_2$—, which optionally carries an organic substituent
or mixtures thereof.

9. The method according to claim 8, wherein in the meaning of X', the organic groups are selected from $C_{1-6}$ linear or branched alkyl, $C_{1-6}$ linear or branched alkoxy groups, $C_{5-12}$-cycloalkyls and aryl groups having 1 to 3 rings, and wherein at least one of the hydrogen terminals of the organic groups is optionally substituted by one or several substituents selected from the group of halogen, hydroxyl, carboxy, anhydride, oxo, nitro, amido and unsaturated hydrocarbyl groups.

10. The method according to claim 1, wherein the liquid phase polymers are deposited by spin-on, spray, ink-jet, roller, gravure, flexographic, curtain or screen printing coating.

11. The method according to claim 1, wherein the photonic crystal layers are incorporated into an organic light emitting diode.

12. The method of claim 1 wherein the first optical material is a titanium oxide polymer or a tantalum oxide polymer and the second optical material is an organosiloxane polymer.

13. A method of making a photonic crystal device comprising the steps of
providing a substrate consisting of glass, plastic, silicon, or ceramic;
forming a plurality of micro-optical structures containing a first optical material having only a single index of refraction at a wavelength of 632.8 nm by depositing on the substrate a metal oxide polymer in the liquid phase and heating to remove the solvent and form a first layer;
depositing directly on only the first layer in a single step a metalloid oxide polymer in the liquid phase and heating to remove the solvent and form a second optical material having only a single index of refraction at a wavelength of 632.8 nm which single index of refraction is lower than that of the first optical material to form a second layer; and
depositing a third optical material having only a single index of refraction at a wavelength of 632.8 nm, which single index of refraction is on the same order as or lower than that of the second optical material;
wherein
the index of refraction of the first optical material is 1.9 or higher at a wavelength of 632.8 nm; and
the index of refraction of the second optical material is 1.4 or less at a wavelength of 632.8 nm; and
wherein the second layer does not contact the substrate and the third layer does not contact the first layer.

14. A photonic crystal device, comprising:
a substrate consisting of glass, plastic, silicon or ceramic;
a first continuous layer disposed directly on the substrate, wherein the first layer consists of a first optical material having only a single index of refraction of 1.9 or higher at a wavelength of 632.8 nm;
a second layer disposed directly on only the first layer, wherein the second layer consists of a second optical material having only a single index of refraction of 1.4 or less at a wavelength of 632.8 nm;
a third layer disposed directly on only the second layer, wherein the third layer consists of a third optical material having only a single index of refraction of 1.4 or less at a wavelength of 632.8 nm;
wherein the first optical material is formed by depositing directly on the substrate a metal oxide polymer in the liquid phase and heating to form the first optical material, the second optical material is formed by depositing directly on the first optical material a metalloid oxide polymer and heating to form the second optical material; and the third optical material is formed by depositing directly on the second optical material a metalloid oxide polymer and heating to form the third optical material; and wherein the second layer does not contact the substrate and the third layer does not contact the first layer.

15. The device of claim 14 wherein the first optical material is a titanium oxide polymer or a tantalum oxide polymer and the second optical material is an organosiloxane polymer.

16. The photonic crystal device according to claim 14, wherein the first layer and the second layer are disposed on two sides of the substrate.

17. The photonic crystal device according to claim 14, wherein the substrate is flexible.

18. The photonic crystal device according to claim 14, wherein the device is utilized as a dual display and keypad light source.

19. The photonic crystal device according to claim 14, wherein the device is utilized with a passive matrix or active matrix display.

20. The photonic crystal device according to claim 14, wherein the device is utilized as an illumination source.

21. The device of claim 15 wherein the third layer is an organosiloxane polymer.

22. The method of claim 12 wherein the third layer is an organosiloxane polymer.

* * * * *